(12) United States Patent
Weyer

(10) Patent No.: US 12,740,160 B2
(45) Date of Patent: Sep. 15, 2026

(54) VEHICLE EXTERIOR STRUCTURE COMPRISING SOLAR CELLS AND ILLUMINATION ELEMENTS

(71) Applicant: Magna Exteriors GmbH, Sailauf (DE)

(72) Inventor: Tobias Weyer, Cologne (DE)

(73) Assignee: Magna Exteriors GmbH, Sailauf (DE)

( * ) Notice: Subject to any disclaimer, the term of this patent is extended or adjusted under 35 U.S.C. 154(b) by 0 days.

(21) Appl. No.: 18/923,958

(22) Filed: Oct. 23, 2024

(65) Prior Publication Data

US 2025/0160005 A1 May 15, 2025

(30) Foreign Application Priority Data

Nov. 13, 2023 (DE) ........................ 102023211216.7

(51) Int. Cl.
*H10F 19/80* (2025.01)
*B60K 35/22* (2024.01)
*B60L 1/00* (2006.01)

(52) U.S. Cl.
CPC ............ *H10F 19/80* (2025.01); *B60K 35/22* (2024.01); *B60L 1/00* (2013.01); *B60K 2360/332* (2024.01)

(58) Field of Classification Search
CPC ... H10F 19/80; B60K 35/22; B60K 2016/003; B60K 2360/332; B60L 1/00; B60L 8/003
See application file for complete search history.

(56) References Cited

U.S. PATENT DOCUMENTS

2022/0242210 A1* 8/2022 Williams ............... B60J 7/1607
2024/0181861 A1* 6/2024 Perlo ...................... B60J 5/0443

FOREIGN PATENT DOCUMENTS

| | | | |
|---|---|---|---|
| CN | 114038347 | A | 2/2022 |
| DE | 102012200864 | A1 | 7/2013 |
| EP | 2878518 | B1 | 6/2017 |
| EP | 3802289 | B1 | 8/2022 |
| IT | 201900012141 | A1 | 1/2021 |
| WO | 2021009719 | A1 | 1/2021 |
| WO | 2022224210 | A1 | 10/2022 |

* cited by examiner

*Primary Examiner* — Mayla Gonzalez Ramos
(74) *Attorney, Agent, or Firm* — Dickinson Wright PLLC

(57) ABSTRACT

A vehicle exterior structure comprising a solar panel, wherein either the vehicle exterior structure or a base sheet separate therefrom forms a base sheet which supports a layer of monocrystalline solar cells or a thin-film photovoltaic material which is/are covered towards the vehicle outer surface, and wherein illumination elements are installed in one of the layers in the layer structure of the solar panel.

12 Claims, 2 Drawing Sheets

VEHICLE EXTERIOR STRUCTURE COMPRISING SOLAR CELLS AND ILLUMINATION ELEMENTS

CROSS-REFERENCE TO RELATED APPLICATIONS

This application claims priority to DE 102023211216.7 filed Nov. 13, 2023. The entire disclosure of the above application is incorporated herein by reference.

FIELD OF THE INVENTION

The present invention relates to a vehicle exterior structure comprising solar cells and illumination elements.

BACKGROUND OF THE INVENTION

This section provides information related to the present disclosure which is not necessarily prior art.

Energy management, energy generation or energy optimization is of increasing importance for many electric vehicles, especially when the number of components illuminated is considered. To recover some of this energy, use is made of solar panels.

EP 2 878 518 B1 shows a solar cell unit comprising a multiplicity of solar cells which are arranged in planar form in spaced relation to each other and a sealing resin which seals the multiplicity of solar cells, a roof panel which is transparent and is arranged for covering, said roof panel covering the solar cell unit from above, and a reinforcing element which is arranged under the solar cell unit.

Of advantage for vehicles are film solar panels, which can be easily fitted to contours.

DE 10 2012 200 864 A1 relates to a process for producing a moulded part comprising at least one organic photovoltaic module. In order to provide dimensionally stable photovoltaic modules for any shaped surface, the process comprises the process steps of: a) manufacturing at least one organic photovoltaic module on a planar substrate; b) shaping the substrate provided with the at least one organic photovoltaic module to form at least one curved surface section comprising at least one organic photovoltaic module; and c) fixing the shape obtained in process step b). Additionally presented are moulded parts in which at least one curved surface section comprises at least one organic photovoltaic module.

EP 3 802 289 B1 shows a configuration in which a solar cell film is applied directly to the fibre composite plastic of the exterior part. Such photovoltaically active solar cell films are extremely thin films comprising solar cells correspondingly formed thereon. Such flexible solar cell films consist of a thin support film, composed of polyimide for example, applied to which is a photovoltaically active layer, composed of cadmium telluride for example, the back of which is optionally encased by another extremely thin support film, composed of polyimide for example. The entire film or layer structure is extremely thin and therefore extremely flexible. According to a particularly advantageous embodiment, the solar cell section may be coated with a transparent coating layer. In this case, the coating of the coating layer may be, for example, an epoxy coating and/or a polyimide coating. Such a configuration not only makes it possible to dispense with a corresponding protective layer/top layer in the solar cell section or to provide a simpler design thereof, but also makes it possible to coat the outer surface completely in one pass in a final step.

Irrespective of the type of solar panel, be it rigid or film-flexible, there is a need to provide information and/or illumination externally.

WO 2022/224 210 A1 discloses a vehicle which has a frame structure partly equipped with solar panels. The solar panels are installed as individual cells, and so free strips or zones are formed between said cells. Installed in said strips or zones are LED light sources.

WO 2021/009 719 A1 discloses a solar panel as used as a display panel in the city and in the country.

The described solar panel has a structure which shows the solar cell between covering films, and this photoactive stack is installed on a back wall. The whole is covered with a glass pane. Applied to the actual solar cell is a display layer comprising light sources.

SUMMARY OF THE INVENTION

This section provides a general summary of the disclosure, and is not a comprehensive disclosure of its full scope or all of its features.

It is an object of the invention to specify a vehicle exterior structure for the exteriors of a vehicle which supports solar panels and is illuminated via LEDs in the solar panels.

The object is achieved by a vehicle exterior structure comprising a solar panel, wherein either the vehicle exterior structure or a base sheet separate therefrom forms a base sheet which supports a layer of monocrystalline solar cells or a thin-film photovoltaic material which is/are covered towards the vehicle outer surface, wherein illumination elements are installed in one of the layers in the layer structure of the solar panel.

The layer of solar cells or of thin-film photovoltaic material is enclosed by plastics films.

The covering layer is a coating layer.

It is advantageous that the illumination elements are installed in openings between monocrystalline solar cells or in recesses of the thin-film photovoltaic material.

The illumination elements are installed in the base sheet or the plastics films or the covering layer.

It is advantageous that the illumination elements are individually controllable and serve as display elements.

The energy generated in the solar panels is stored in a battery of the vehicle, wherein a separate battery for at least one solar panel is installed close to one of the solar panels.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DESCRIPTION OF THE INVENTION

Figure 1:
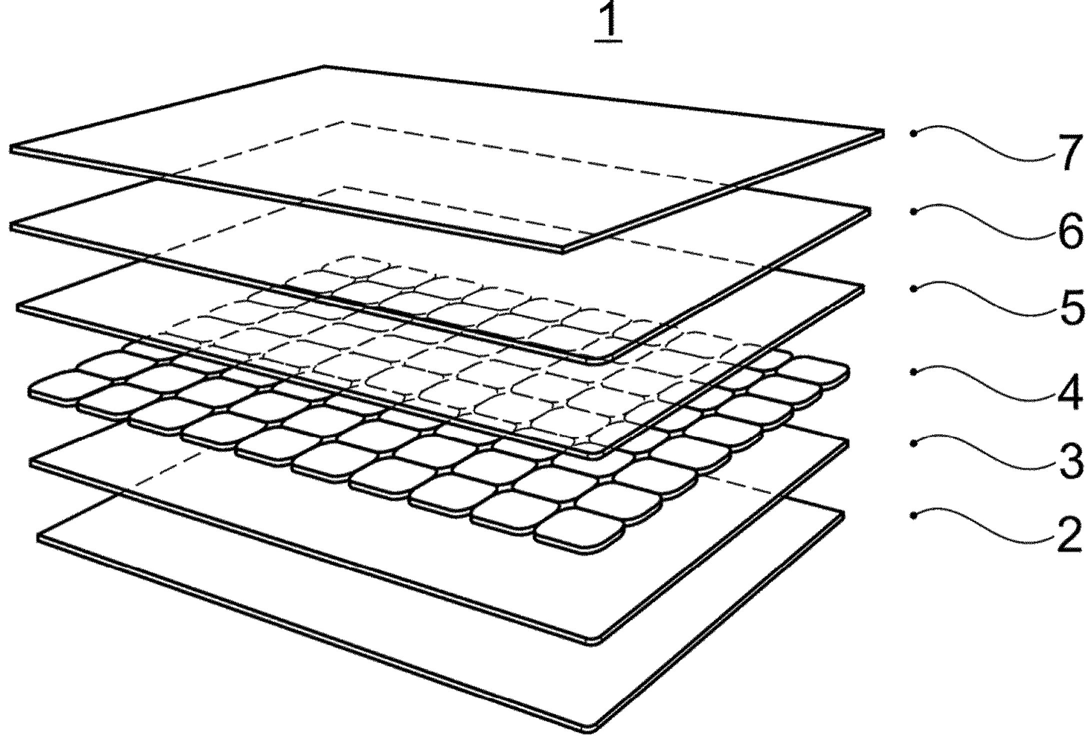
FIG. 1 shows a structure of a solar panel.

FIG. 1 illustrates a known layer structure for a solar panel. The solar panel 1 is built on a base sheet 2, which may be a glass sheet or a plastics film. This is followed by a plastics layer 3. The next layer installed are solar cells 4 which are already electrically connected. The solar cells are covered by a further plastics layer 5 which, together with the plastics layer 3, provides insulation and sealing for the solar cells 4. Installed on the front is a front glass or front film 6 which is retained by a frame 7.

The prior art shown depicts monocrystalline solar cells 4 which are connected in series. Thin-film technology solar panels can also be used for the inventive solution.

Figure 2:
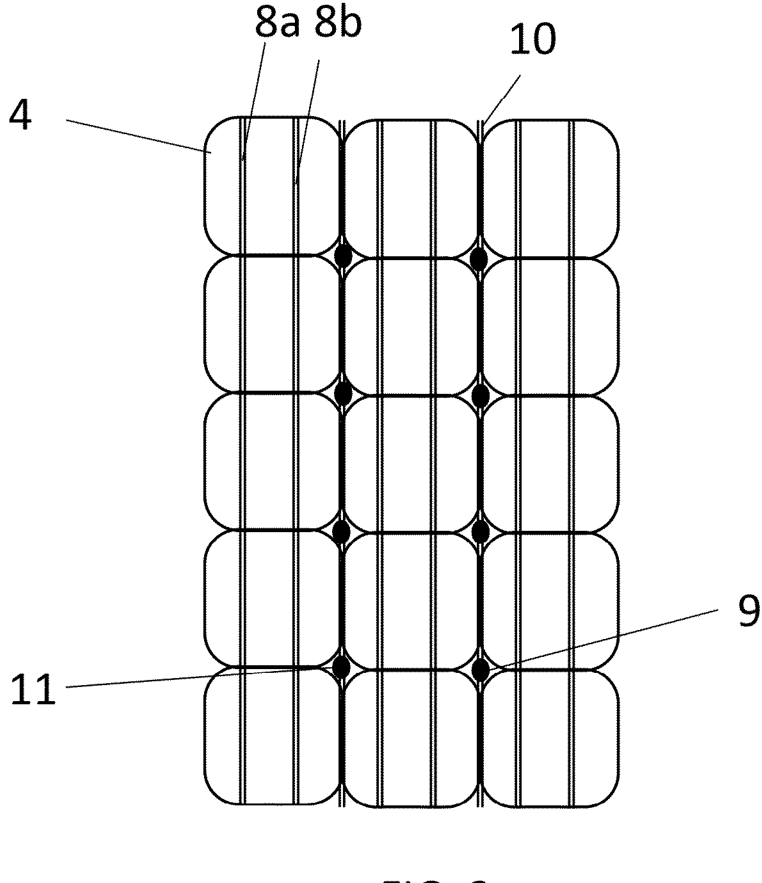
FIG. 2 shows a solar panel comprising LEDs.

FIG. 2 depicts crystalline solar cells 4. The solar cells 4 are arranged in series and are electrically contacted via contact 8*a* and 8*b*. This example shows that the five solar cells one above the other are connected in series. The adjacent row of solar cells 4 is likewise connected in series.

An individual crystalline solar cell 4 in this exemplary embodiment has flattened corners on a square footprint. This means that every contact area between four solar cells in the assembly has an opening 11.

Inserted into the opening 11 is at least one LED 9 in each case. The LEDs 9 are likewise inter-connected in series and sit on a conduction strip 10. However, the LEDs may also be controlled and supplied via the conduction strip 10 separately from one another.

If a different arrangement of the LEDs 9 is desired, the solar cells 4 must have a different shape and size.

When use is also made of thin-film technology to apply the photosensitive layers, it is possible to install LEDs 9. This requires the provision of recesses when applying the photosensitive materials, so that LEDs 9 can be mounted in said recesses.

In a further embodiment, the LEDs 9 are not installed in the layer of the solar cells 4, but in one of the plastics layers 3, 5 or even in the front glass or front film 6.

If transparent solar cells are used, it is also possible to install the LEDs in the base sheet 2.

The LEDs 9 are electrically connected via conductor tracks, which may run parallel to the contacts of the solar cells. The actual electrical connections of the solar cells in the frame 7 may also be used to control the LEDs.

If the display of messages is desired beyond the mere illumination function of the LEDs, a much denser arrangement of the LEDs is required. Thin-film technology would be particularly suitable for this purpose, since recesses are easy to produce in this case. What are then installed in the recesses are LEDs 9 which can be individually controlled and thus provide a screen function.

Figure 3:
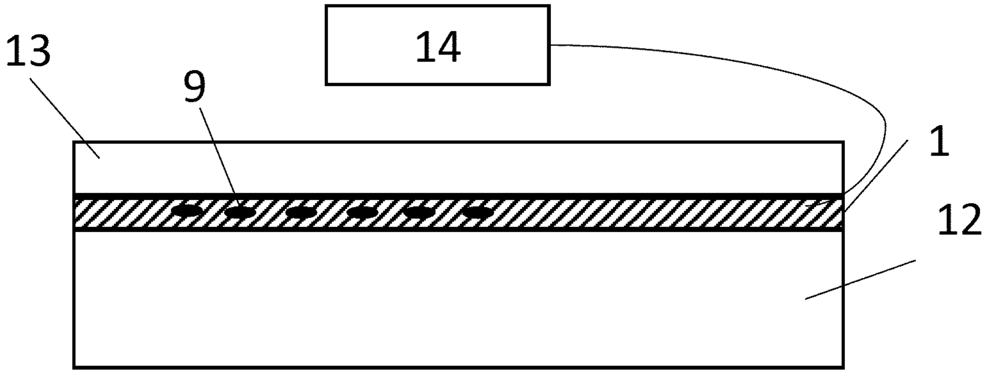
FIG. 3 shows a structure on a vehicle outer skin.

FIG. 3 shows how the structure can be effected on a vehicle. A component of the vehicle exterior structure 12 is covered by a flexible solar panel 1. LEDs 9 are installed in the solar panel 1, and the layer of the structure in which the LEDs 9 are installed can be any layer. The solar panel 1 on the vehicle is covered by a transparent coating layer 13.

The energy collected from the solar panel is supplied to a battery 14 of the vehicle.

It is not relevant whether the battery is a vehicle battery or a separate battery installed in the vicinity of a solar panel. Structural vicinity means that the separate battery 14 has a shorter cable connection between solar panel 1 and battery 14 compared to the cable connection between solar panel 1 and vehicle battery.

If the battery is installed directly on the solar panel, this allows the design of a solar module which is installed as a module on the vehicle.

What is claimed is:

1. A vehicle exterior structure comprising:

a solar panel having a layer structure including a base sheet that supports a layer of photovoltaic material, wherein the layer structure further includes a lower plastic film above the base sheet, an upper plastic film above the lower plastic film, and a covering layer above the upper plastic film;

wherein the photovoltaic material is encased between the upper plastic film and the lower plastic film;

wherein illumination elements are installed in one of the layers of the layer structure of the solar panel and the covering layer is a coating layer;

wherein the photovoltaic material defines a plurality of openings, wherein the illumination elements are disposed in the openings;

wherein the photovoltaic material is a thin film of photovoltaic material; and wherein the openings are defined as recesses in the thin film.

2. The vehicle exterior structure according to claim 1, wherein the illumination elements are installed in the thin film.

3. The vehicle exterior structure according to claim 1, wherein the illumination elements are LEDs.

4. The vehicle exterior structure according to claim 1, wherein the illumination elements are individually controllable and serve as display elements.

5. The vehicle exterior structure according to claim 1, wherein the energy generated in the solar panel is stored in a battery of the vehicle, wherein the battery is a separate battery for the solar panel and is installed close to the solar panel.

6. A vehicle exterior structure comprising:

a solar panel having a layer structure including a base sheet that supports a layer of photovoltaic material, wherein the layer structure further includes a lower plastic film above the base sheet, an upper plastic film above the lower plastic film, and a covering layer above the upper plastic film;

wherein the photovoltaic material is encased between the upper plastic film and the lower plastic film;

wherein illumination elements are installed in one of the layers of the layer structure of the solar panel and the covering layer is a coating layer;

wherein the photovoltaic material defines a plurality of openings, wherein the illumination elements are disposed in the openings;

wherein the photovoltaic material is defined by a plurality of monocrystalline solar cells;

wherein four solar cells have a contact area therebetween, wherein the contact area defines the opening in which the illumination element is disposed; and wherein the solar cells are arranged in series in a row and electrically contacted via contact strips, wherein an adjacent row is also arranged in series and electrically contacted via contact strips, wherein the illumination elements are interconnected in series and sit on a conduction strip.

7. The vehicle exterior structure of claim 6, wherein the openings are defined between adjacent corners of the solar cells.

8. The vehicle exterior structure of claim 7, wherein the openings are enclosed on their periphery by the adjacent corners.

9. The vehicle exterior structure of claim 6, wherein the conduction strip is parallel to the contact strips of the solar cells.

10. The vehicle exterior structure according to claim 6, wherein the illumination elements are LEDs.

11. The vehicle exterior structure according to claim 6, wherein the illumination elements are individually controllable and serve as display elements.

12. The vehicle exterior structure according to claim 6, wherein the energy generated in the solar panel is stored in a battery of the vehicle, wherein the battery is a separate battery for the solar panel and is installed close to the solar panel.

* * * * *